United States Patent
Komatsu

(10) Patent No.: US 10,333,484 B2
(45) Date of Patent: Jun. 25, 2019

(54) FILTER MODULES AND FILTER ARRAYS HAVING INDUCTIVE IMPEDANCE

(71) Applicant: SKYWORKS SOLUTIONS, INC., Woburn, MA (US)

(72) Inventor: Tomoya Komatsu, Daito (JP)

(73) Assignee: SKYWORKS SOLUTIONS, INC., Woburn, MA (US)

( * ) Notice: Subject to any disclaimer, the term of this patent is extended or adjusted under 35 U.S.C. 154(b) by 92 days.

(21) Appl. No.: 15/790,151

(22) Filed: Oct. 23, 2017

(65) Prior Publication Data
US 2018/0131344 A1    May 10, 2018

Related U.S. Application Data

(60) Provisional application No. 62/491,330, filed on Apr. 28, 2017, provisional application No. 62/418,961, filed on Nov. 8, 2016.

(51) Int. Cl.
*H03H 7/075*    (2006.01)
*H03H 9/64*    (2006.01)

(52) U.S. Cl.
CPC .......... *H03H 7/075* (2013.01); *H03H 9/6409* (2013.01); *H03H 9/6483* (2013.01)

(58) Field of Classification Search
CPC ...... H03H 7/075; H03H 7/964; H03H 9/6416; H03H 9/6483
USPC ......................................... 333/124, 187, 193
See application file for complete search history.

(56) References Cited

U.S. PATENT DOCUMENTS

| | | | | |
|---|---|---|---|---|
| 7,683,736 B2 * | 3/2010 | Inoue | ............ | H03H 9/0576 333/129 |
| 8,026,776 B2 * | 9/2011 | Ueda | ............ | H03H 9/6483 333/133 |
| 9,041,487 B2 * | 5/2015 | Tanaka | ............ | H03H 9/6436 310/313 B |
| 10,200,012 B2 * | 2/2019 | Tsukamoto | ............ | H03H 9/0009 |
| 2018/0123547 A1 * | 5/2018 | Kato | ............ | H03H 7/01 |

* cited by examiner

*Primary Examiner* — Dean O Takaoka
(74) *Attorney, Agent, or Firm* — Lando & Anastasi, LLP

(57) ABSTRACT

Aspects and examples reduce the insertion loss and the noise figure of a filter module, which is configured by capacitive elements such as surface acoustic wave resonators and impedance matched. In one example, the filter module includes a filter having a certain passband and a matching resonator for impedance matching of the filter, the passband of the filter being included in a frequency band ranging between a resonant frequency and an antiresonant frequency of the matching resonator, and a center frequency of the passband of the filter being lower than a center frequency of the band ranging between the resonant frequency and the antiresonant frequency of the matching resonator.

20 Claims, 10 Drawing Sheets

FILTER MODULES AND FILTER ARRAYS HAVING INDUCTIVE IMPEDANCE

CROSS-REFERENCE TO RELATED APPLICATIONS

This application claims the benefit under 35 U.S.C. § 119(e) of U.S. Provisional Application No. 62/491,330 titled "FILTER MODULES AND FILTER ARRAYS HAVING INDUCTIVE IMPEDANCE" filed on Apr. 28, 2017, and of U.S. Provisional Application No. 62/418,961 titled "FILTER MODULES AND FILTER ARRAYS HAVING INDUCTIVE IMPEDANCE" filed on Nov. 8, 2016, each of which is herein incorporated by reference in its entirety for all purposes.

BACKGROUND

Conventionally, in a communication device such as a mobile phone, a filter device has been used to separate a transmission signal from another signal having different band, such as a reception signal, for example. Band-pass filters have been used for the filter device. These band-pass filters can be configured using a surface acoustic wave (SAW) resonator including one or more interdigital transducer (IDT) electrodes and reflectors, all of which are formed on a piezoelectric substrate made of lithium niobate or lithium tantalate. A filter configured with capacitive elements such as SAW resonators has a capacitive impedance, and therefore an inductive element is sometimes connected between the filter and an external terminal to achieve impedance matching.

FIG. 1A illustrates a first example of a conventional filter module 100 in which a matching inductor 110 is applied to a band-pass filter 120. As shown in the circuit diagram of FIG. 1A, the matching inductor 110 is connected in series with and preceding the filter 120. Referring to the Smith chart of FIG. 1B, the impedance of the first conventional filter module 100 in the passband of the filter 120 is indicated by a solid line 130. The impedance 130 appears on the upper half of the Smith chart and is inductive. For comparison purposes, a comparative impedance of the filter 120 alone or without the matching inductor 110 is shown by a dashed line 135. This comparative impedance 135 appears on the lower half of the Smith chart and is capacitive.

FIG. 2 illustrates a second example of a conventional filter module 100a in which a matching inductor 110 is applied to a band-pass filter 120. As shown in the diagram of FIG. 2A, the matching inductor 110 is connected in parallel with and preceding the filter 120. In other words, the inductor 110 is connected between the ground and a node 125 joining the input terminal 115 with the filter 120. Referring to the Smith chart of FIG. 2B, the impedance of the second conventional filter module 100a in the passband of the filter 120 is indicated by a solid line 140. The impedance 140 appears on the upper half of the Smith chart and is inductive. For comparison purposes, the impedance of the filter 120 alone or without the matching inductor 110 shown by a dashed line 145, which largely appears on the lower half of the Smith chart and is capacitive.

SUMMARY OF INVENTION

Aspects and embodiments relate to a filter module including a band-pass filter, and to a filter array including a plurality of band-pass filters.

When an inductive element is applied for matching purposes to a filter configured with capacitive elements such as SAW resonators, the filter sometimes has a lower Q factor such that the insertion loss and the noise figure of the filter may be degraded.

Aspects and embodiments proposed in view of the above described problem provide a filter module including a band-pass filter configured with capacitive elements such as SAW resonators, the filter module being impedance matched to reduce the insertion loss and the noise figure. Furthermore, aspects and embodiments provide a filter array including a plurality of band-pass filters, the filter array being impedance matched to reduce the insertion loss and the noise figure.

A filter module according to certain embodiments includes a filter having a certain passband, and a matching resonator for impedance matching of the filter, the passband of the filter being included in a band ranging between a resonant frequency and an antiresonant frequency of the impedance matching resonator. A center frequency of the passband of the filter may be lower than a center frequency of the band ranging between the resonant frequency and the antiresonant frequency of the matching resonator.

The filter may be disposed on a signal path extending from an input contact toward an output contact of the filter module, and the matching resonator may be disposed between the input contact and the filter or between the filter and the output contact.

The matching resonator may be connected in parallel between a ground and a node joining the input contact with the filter or a node joining the filter with the output contact. The filter module may further include an extension coil connected in series with the matching resonator. The extension coil may be disposed on the node side or the ground side of the matching resonator.

The matching resonator may be connected in series between the input contact and the filter or in series between the filter and the output contact. The filter module may further include an extension coil connected in parallel with the matching resonator.

The filter and the matching resonator may include at least one of a surface acoustic wave resonator, a bulk acoustic wave resonator, and a film bulk acoustic wave resonator. The filter may be a ladder-type filter or a longitudinal-coupling-type filter. The matching resonator may be a surface acoustic wave resonator formed on a substrate made of lithium niobate, potassium niobate, lithium tantalite, tellurium dioxide, or tantalum pentoxide, for example. The matching resonator and the filter may be formed on respective separate substrates. Alternatively, the matching resonator and the filter may be formed on the same single substrate.

A filter array according to certain embodiments includes a first filter having a first passband, a second filter having a second passband, a matching resonator for the first filter and the second filter, and a changeover switch connecting the matching resonator to a switched one of the first filter and the second filter, the first passband and the second passband being included in a band ranging between a resonant frequency and an antiresonant frequency of the matching resonator. Each of a center frequency of the first passband and a center frequency of the second passband may be lower than a center frequency of the band ranging between the resonant frequency and the antiresonant frequency of the matching resonator.

According to certain aspects and embodiments, matched impedance can be provided and the insertion loss and the noise figure can be reduced.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures.

DETAILED DESCRIPTION

Aspects and embodiments are described below in detail with reference to the drawings.

Figure 3:
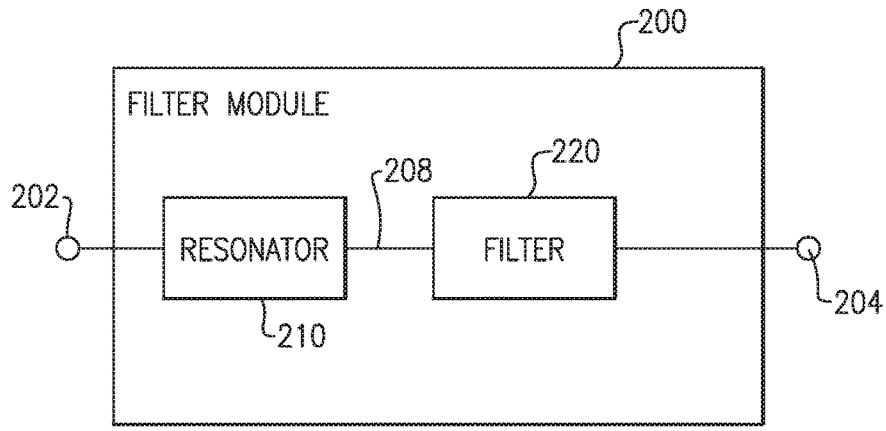
FIG. 3 is a block diagram of one example of a filter module according to certain embodiments.

FIG. 3 is a block diagram showing an example of a filter module 200 according to certain embodiments. The filter module 200 includes a filter 220 and a matching resonator 210. In one example the filter 220 is a band-pass filter that passes a certain band and has an impedance matched to be inductive.

As shown in FIG. 3, the band-pass filter 220 is disposed along a signal path 208 extending from an input contact 202 of the filter module 200 to an output contact 204 of the filter module 200. Furthermore, as also shown in FIG. 3, the filter module 200 according to certain embodiments includes a matching resonator 210 connected between the input contact 202 and the filter 220. In one example the matching resonator 210 is a SAW resonator. According to certain embodiments, the filter 220 is configured such that its passband is included in a band ranging between a resonant frequency and an antiresonant frequency of the matching resonator 210.

Figure 4:
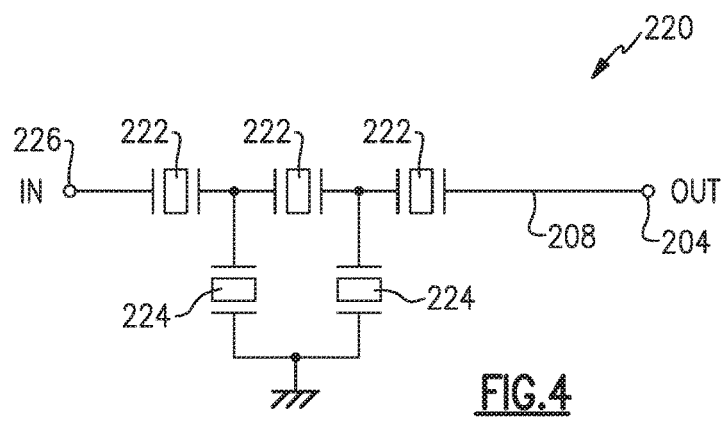
FIG. 4 is a circuit diagram illustrating one example of a ladder-type configuration of a filter according to certain embodiments.

In one example the filter 220 has a ladder-type filter configuration, and may be implemented using surface acoustic wave (SAW) resonators. An example of a ladder-type filter configuration is shown in FIG. 4. In certain examples, the ladder-type filter forming the filter 220 is configured by a plurality of series resonators 222 and parallel resonators 224. The plurality of series resonators 222 are connected in series with one another along the signal path 208 between an input 226 of the filter 220 and the output contact 204. The plurality of parallel resonators 224 are connected between the signal path 208 and ground. The series resonators 222 are configured to have a passband in which a resonant frequency is positioned, and the parallel resonators 224 are configured to have a passband in which an antiresonant frequency is positioned. In contrast, the matching resonator 210 has a passband included in a band ranging between a resonant frequency and an antiresonant frequency of the matching resonator, such that the matching resonator has frequency characteristics different from both the series resonators 222 and the parallel resonators 224 forming the ladder-type filter.

Figure 1A:
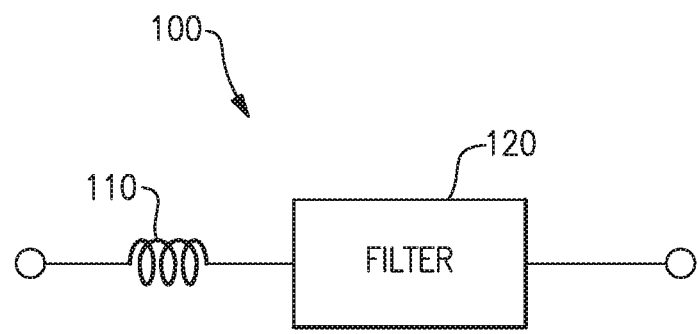
FIG. 1A is a diagram of a first example of a conventional filter module.
Figure 1B:
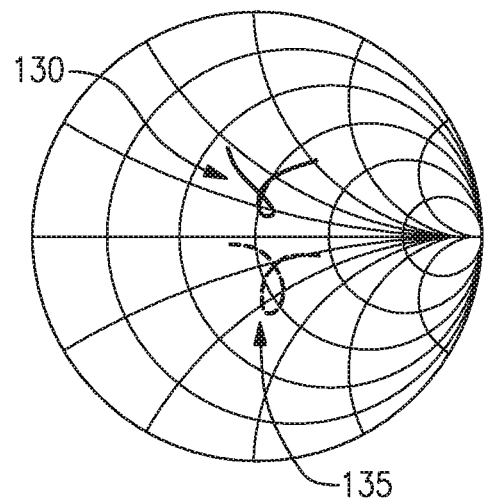
FIG. 1B is a Smith chart corresponding to the first conventional filter module of FIG. 1A.
Figure 2A:
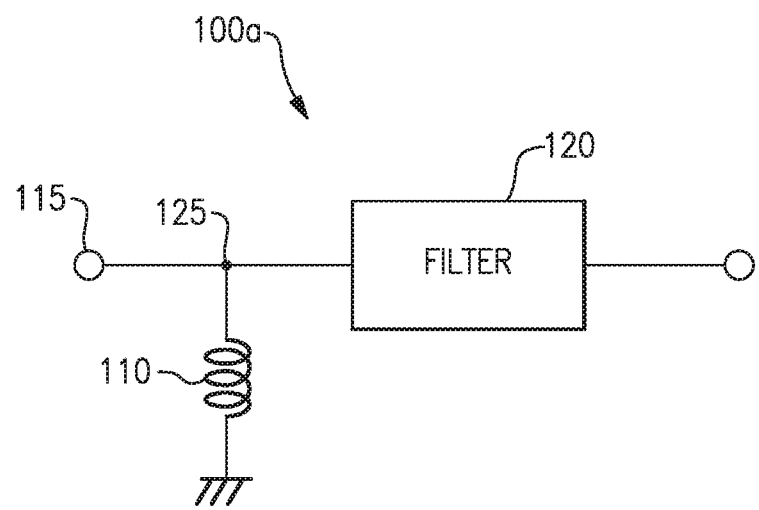
FIG. 2A is a diagram of a second example of a conventional filter module.
Figure 2B:
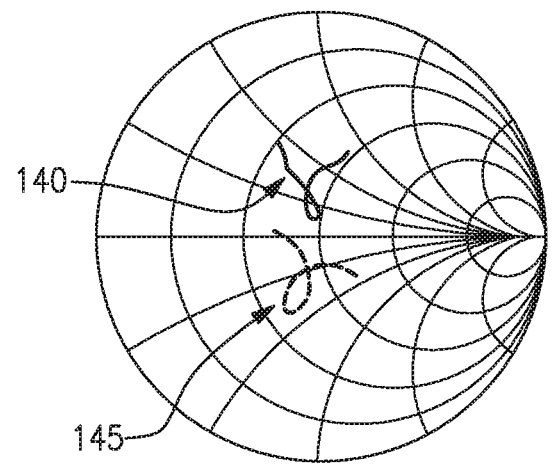
FIG. 2B is a Smith chart corresponding to the second conventional filter module of FIG. 2A.

According to certain embodiments, the matching resonator 210 in the filter module 200 is inductive in the passband of the filter 220 and therefore operates as an inductor. As a result, the filter module 200 according to certain embodiments can achieve an impedance in the passband of the filter module that is inductive without adding a matching inductor 110 in a conventional manner (such as shown in FIGS. 1 and 2).

Furthermore, the matching resonator 210 according to certain embodiments has a higher Q factor in an inductive region, for example more than 100, as compared to a conventional matching inductor 110. As discussed above, the lower Q associated with a conventional matching inductor 110 can degrade the insertion loss and noise figure of the filter. In contrast, because the matching resonator 210 may have a higher Q, it may have less negative impact on the performance of the filter module 200.

The filter module 200 according to certain embodiments is designed to have a center frequency of the passband of the filter 220 be lower than a center frequency of the band ranging between the resonant frequency and the antiresonant frequency of the matching resonator 210. The filter module 200 according to certain embodiments has frequency characteristics such that the passband of the filter 220 can be positioned in a region where an inductive component of the matching resonator 210 has smaller variations to facilitate the matching.

It is to be appreciated that, although the filter module 200 according to certain embodiments includes a filter 220 using a ladder-type filter configured by SAW resonators, other embodiments are not limited thereto. The filter 220 according to other embodiments can include bulk acoustic wave (BAW) resonators or film bulk acoustic wave resonators (FBARs), for example, instead of or in addition to SAW resonators. Furthermore, although the filter 220 is a ladder-type filter in some embodiments, other embodiments are not limited thereto, and the filter 220 may have other configurations. For example, the filter 220 may be a longitudinal-coupling-type filter.

Although the filter module 200 according to certain embodiments uses a SAW resonator for the matching resonator 210, other embodiments are not limited thereto. The matching resonator 210 according to some embodiments may be implemented using a bulk acoustic wave (BAW) resonator or a film bulk acoustic wave resonator (FBAR), for example.

In the example of the filter module 200 shown in FIG. 3, the matching resonator 210 is connected to an input of the filter 220; however, in other embodiments the matching resonator 210 may be connected at an output of the filter 220, i.e., between the filter 220 and the output contact 204. Accordingly, although the embodiments described below are exemplified by matching resonator 210 being disposed at the input of the filter 220 for illustration purposes, the matching resonator can be disposed at the output of the filter.

As described above, the filter module 200 according to certain embodiments is designed to have a passband of the filter 220 positioned in a band ranging between the resonant frequency and the antiresonant frequency of the matching resonator 210. If the passband of the filter 220 is relatively narrow, then the bandwidth between the resonant frequency and the antiresonant frequency of the matching resonator 210 can easily be made broader than the passband of the filter. However, even if the passband of the filter 220 is broader, then the matching resonator 210 can be configured such that the bandwidth between the resonant frequency and the antiresonant frequency of the matching resonator is still broader than the passband of the filter. For example, the bandwidth between the resonant frequency and the antiresonant frequency of the matching resonator 210 can be broadened by appropriately choosing a material for the substrate of the matching resonator. For example, the substrate of the matching resonator 210 can be formed from a material having an electromechanical coupling coefficient (k2) greater than that of the substrate of the filter 220.

The bandwidth between the resonant frequency and the antiresonant frequency of the matching resonator 210 has a positive correlation with the electromechanical coupling coefficient of the substrate. Accordingly, configuring the material used for the substrate of the matching resonator 210 to have a greater electromechanical coupling coefficient may allow the bandwidth between the resonant frequency and the antiresonant frequency to be broader. Therefore, even if the passband of the filter 220 is relatively broad, the passband of the filter can be positioned in the band ranging between the resonant frequency and the antiresonant frequency of the matching resonator 210.

Such a substrate used for the matching resonator 210 and having a greater electromechanical coupling coefficient can be made of lithium niobate ($LiNbO_3$) or potassium niobate ($KNbO_3$) having a low cut angle. Furthermore, Love waves can be used in tellurium dioxide ($TeO_2$) thin film, tantalum pentoxide ($Ta_2O_5$) thin film and the like. Still furthermore, Lamb waves can be used to enhance the electromechanical coupling coefficient. In addition, using different electrode materials between the matching resonator 210 and the filter 220 to enhance the electromechanical coupling coefficient of the matching resonator is effective in a BAW resonator and an FBAR.

As such, even if the passband of the filter 220 is relatively broad, the passband of the filter can be positioned in the band ranging between the resonant frequency and the antiresonant frequency of the matching resonator 210 by appropriately choosing the material for the substrate of the matching resonator. Because the matching resonator 210 has an inductive impedance across a broader passband, the impedance for the passband of the filter module 200 can be configured as inductive.

According to certain examples, when the passband of the filter 220 is relatively broad, an extension coil can be connected to the matching resonator 210 such that the passband of the filter 220 can be included in the band ranging between the resonant frequency and the antiresonant frequency of the matching resonator 210. Mounting an extension coil can shift either the resonant frequency or the antiresonant frequency of the matching resonator 210 such that the bandwidth between the resonant frequency and the antiresonant frequency can be made broader. Configurations of the filter module 200 including such an extension coil are further described below.

Figure 5:
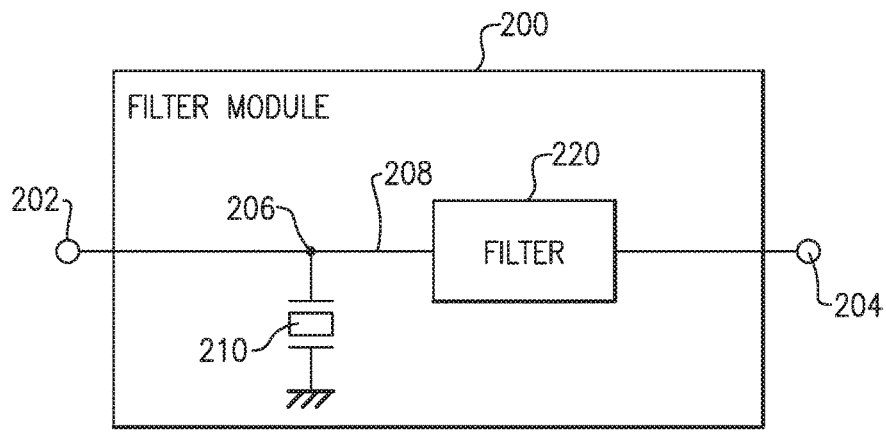
FIG. 5 is a diagram of an example of a filter module according to one embodiment.

FIG. 5 is a circuit diagram illustrating a configuration of the filter module 200 according to one embodiment. In this embodiment, the filter module 200 includes the matching resonator 210 disposed at an input of the filter 220 and connected in a parallel connection manner. In other words, the matching resonator 210 is connected between the ground and a node 206 joining the input contact 202 with the filter 220 along the signal path 208.

The filter module 200 according to the embodiment shown in FIG. 5 is also designed to have a passband of the filter 220 positioned between the resonant frequency and the antiresonant frequency of the matching resonator 210, as discussed above. Furthermore, the filter module 200 is designed to have a center frequency of the passband of the filter 220 be lower than a center frequency of the band ranging between the resonant frequency and the antiresonant frequency of the matching resonator 210.

Figure 6:
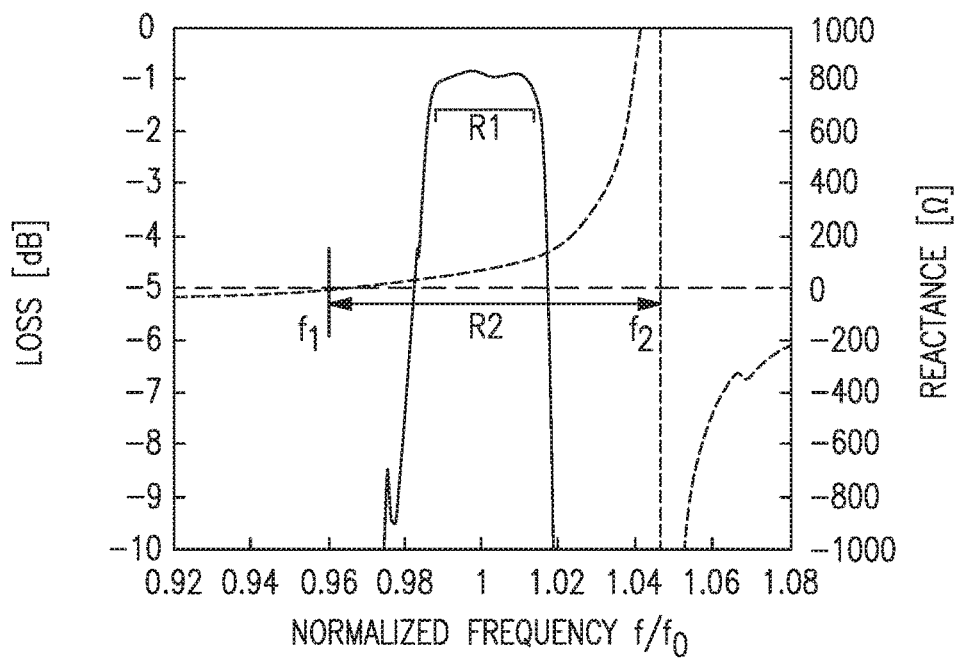
FIG. 6 is a graph showing frequency characteristics of an example of a filter module configured as shown in FIG. 5.

FIG. 6 is a graph showing frequency characteristics of a filter module 200 according to the embodiment of FIG. 5. The horizontal axis of the graph represents a normalized frequency $f/f_0$, which is derived from the passband R1 of the filter 220 being normalized by the center frequency $f_0$. The solid line indicates a loss level of the filter 220, which corresponds to the scale on the left-side of the graph. The dashed line indicates a reactance of the matching resonator 210, which corresponds to the scale on the right-side of the graph.

As discussed above, the filter module 200 according to the embodiment shown in FIG. 5 is designed to have a passband R1 of the filter 220 included in a band R2 ranging between a resonant frequency $f_1$ and an antiresonant frequency $f_2$ of the matching resonator 210. Furthermore, the filter module 200 is designed to have a center frequency $f_0$ of the passband R1 of the filter that is lower than a center frequency of the band R2 ranging between the resonant frequency $f_1$ and the antiresonant frequency $f_2$ of the matching resonator 210.

Figure 7:
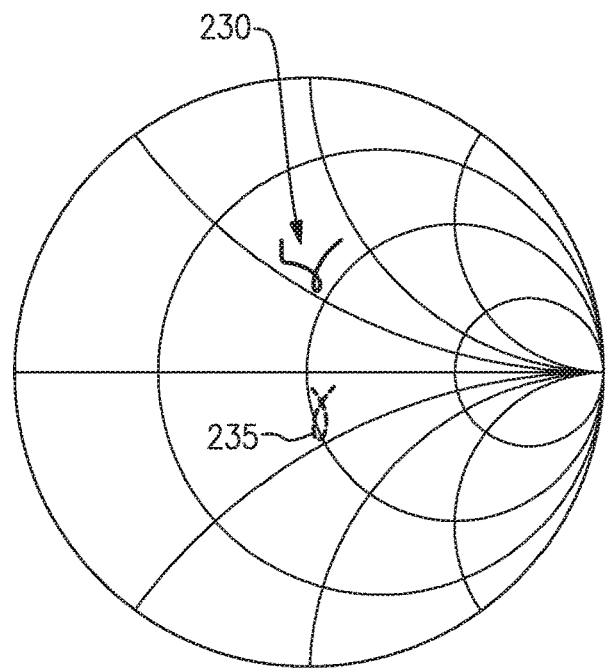
FIG. 7 is a Smith chart showing impedance characteristics of the example of the filter module corresponding to FIG. 5.

FIG. 7 is a Smith chart showing impedance characteristics of a filter module 200 according to the embodiment shown in FIG. 5. The impedance of the passband of the filter module 200 according to this embodiment is indicated by a solid line 230. The impedance 230 appears on the upper half of the Smith chart and is inductive. For comparison purposes, the impedance of the filter 220 alone is indicated by a dashed line 235. In the passband of the filter module 200, the impedance of the filter 220 alone appears on the lower half of the Smith chart and is capacitive.

Figure 8:
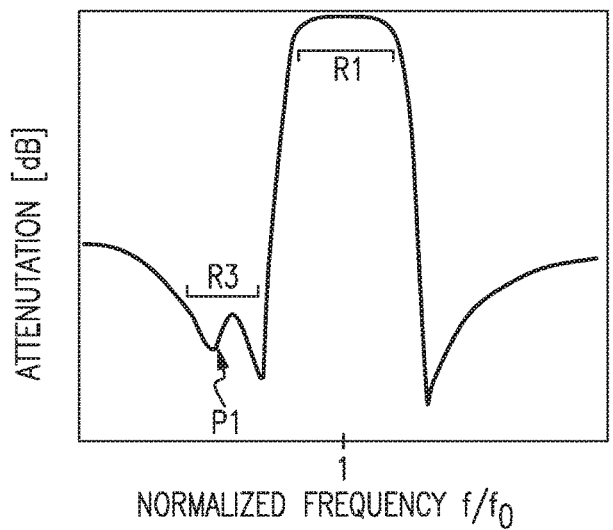
FIG. 8 is a graph showing frequency characteristics of the example of the filter module configured as shown in FIG. 5.

FIG. 8 is a graph showing further frequency characteristics of a filter module 200 according to the embodiment shown in FIG. 5. In particular, FIG. 8 shows attenuation (in dB on the vertical axis) as a function of normalized frequency. Attenuation level increases from the top of the vertical axis (lowest attenuation) down the vertical axis. The filter module 200 according to this embodiment has a passband R1, which is similar to that of the filter 220 as shown by solid line in FIG. 6. As can be seen, there is a notch P1 where the attenuation level is increased in a stopband R3 positioned on a lower frequency side of the passband R1. The notch P1 is equivalent to an attenuation pole corresponding to the resonant frequency of the matching resonator 210.

As discussed above, the filter module 200 according certain embodiments includes the matching resonator 210, which is inductive in the passband of the filter 220, such that the impedance of the passband of the filter module 200 can be configured as inductive without adding the conventional matching inductor (see FIGS. 1 and 2). The matching resonator 210 has a higher Q factor than the conventional matching inductor in the inductive passband such that degradation of the insertion loss and the noise figure due to the matching resonator can be reduced. The passband of the filter 220 is positioned in a region where the inductive component of the matching resonator 210 has smaller variations and the matching can be facilitated.

Furthermore, the resonant frequency of the matching resonator 210 can be an attenuation pole in the filter module 200 according to certain embodiments, as discussed above. Therefore, this may advantageously ensure a desired level of attenuation in the stopband R3 positioned on the lower frequency side of the passband R1 of the filter 220, as shown in FIG. 8.

Figure 9:
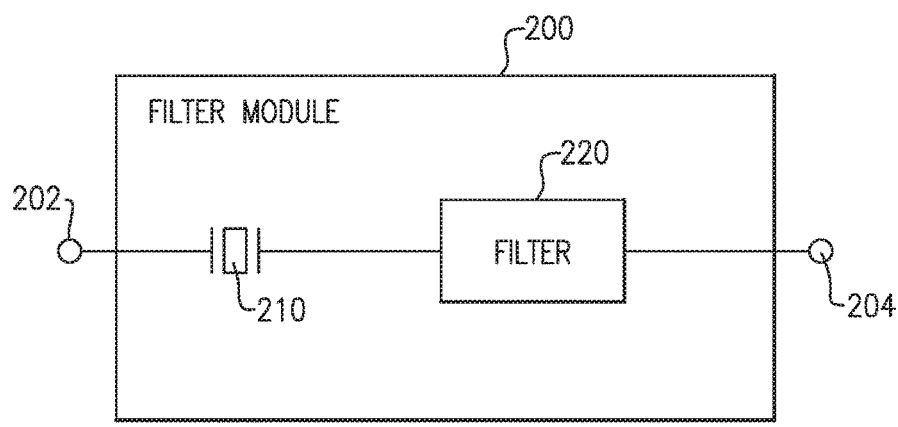
FIG. 9 is a diagram of another example of a filter module according to one embodiment.

FIG. 9 is a circuit diagram showing another configuration of a filter module 200 according to certain embodiments. The filter module 200 in this example includes the matching resonator 210 disposed on the input side of the filter 220 in a series connection manner. In other words, the matching resonator 210 is connected between the input contact 202 and the filter 220.

The filter module 200 according to the embodiment shown in FIG. 9 is also designed to have a passband of the filter 220 included between the resonant frequency and the antiresonant frequency of the matching resonator 210. The filter module 200 is designed to have a center frequency of the passband of the filter 220 lower than a center frequency of the band ranging between the resonant frequency and the antiresonant frequency of the matching resonator 210.

Figure 10:
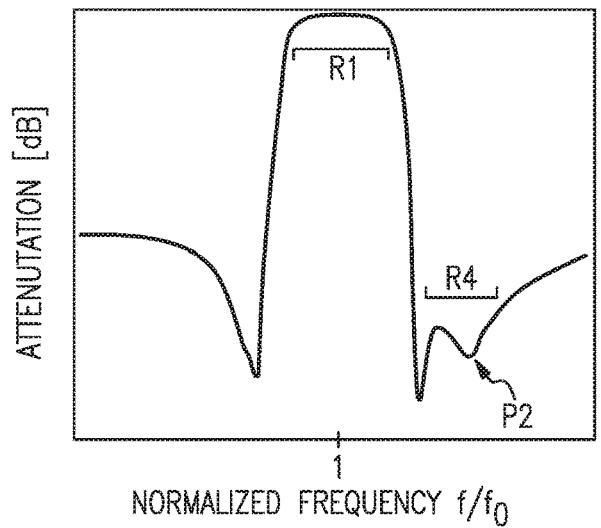
FIG. 10 is a graph showing frequency characteristics of an example of a filter module configured as shown in FIG. 9.

FIG. 10 is a graph showing frequency characteristics of an example of a filter module 200 according to the embodiment shown in FIG. 9. Similar to FIG. 8, FIG. 10 shows attenuation (in dB on the vertical axis) as a function of normalized frequency. Attenuation level increases from the top of the vertical axis (lowest attenuation) down the vertical axis. The filter module 200 of this embodiment has a passband R1. As can be seen, there is a notch P2 where the attenuation level is increased in a stopband R4 positioned on a higher frequency side than the passband R1. This notch P2 is equivalent to an attenuation pole corresponding to the antiresonant frequency of the matching resonator 210.

The filter module 200 according to the embodiment of FIG. 9 includes a matching resonator 210, which is inductive in the passband of the filter 220 such that the impedance of the passband of the filter module 200 can be configured as inductive without adding the conventional matching inductor (see FIGS. 1 and 2). The matching resonator 210 has a higher Q factor than the conventional matching inductor in the inductive region of the passband, such that degradation of the insertion loss and the noise figure due to the matching resonator can be reduced. The passband of the filter 220 is positioned in a region where the inductive component of the matching resonator 210 has smaller variations and the matching can be facilitated.

Furthermore, the antiresonant frequency of the matching resonator can be an attenuation pole in the filter module according to the embodiment of FIG. 9. Therefore, this may advantageously ensure a desired level of attenuation in the stopband R4 positioned on a higher frequency side of the passband R1 of the filter 220.

Figure 11:
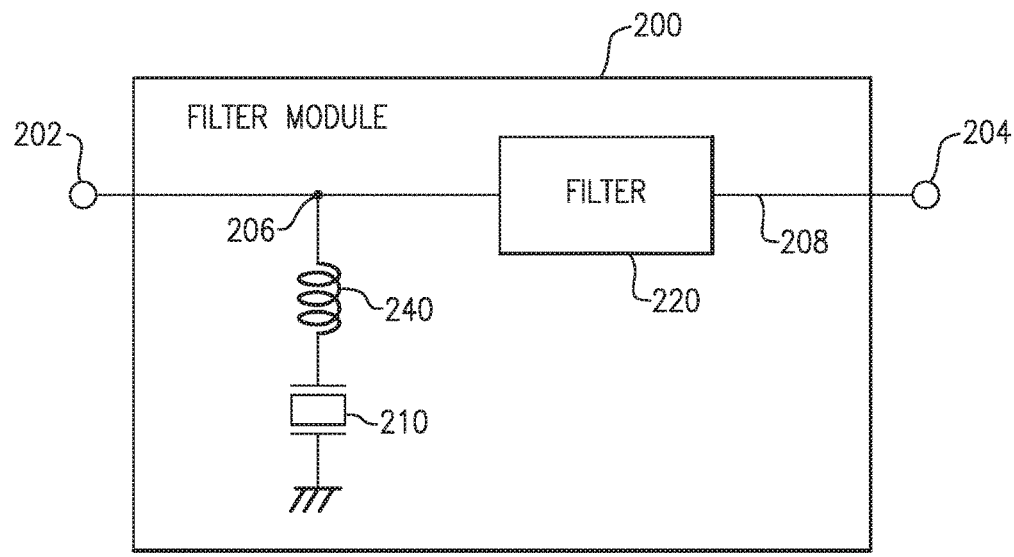
FIG. 11 is a diagram of another example of a filter module according to one embodiment.

FIG. 11 is a circuit diagram showing another example of the filter module 200 according to certain embodiments. In this example, the filter module 200 has a configuration similar to that shown in FIG. 5, and further includes an extension coil 240 connected in series with the matching resonator 210. Thus, the extension coil 240 and the matching resonator 210 are sequentially connected from a node 206 joining the input contact 202 with the filter 220 to the ground in series at the input of the filter.

According to the example shown in FIG. 11, the resonant frequency of the matching resonator 210 is shifted lower compared to a configuration without the extension coil 240. Therefore, even if the passband of the filter is relatively broad, the bandwidth between the resonant frequency and the antiresonant frequency of the matching resonator 210 can be made sufficiently broad such that the passband of the filter 220 can be included in the band ranging between the resonant frequency and the antiresonant frequency of the matching resonator 210. Therefore, even if the passband of the filter is broad, the impedance of the filter module 200 can be configured as inductive.

It is to be appreciated that examples of the filter module 200 including the extension coil 240 are not limited to the configuration in which the extension coil is connected between the node 206 and the matching resonator 210 as shown in FIG. 11. The extension coil 240 may be connected between the matching resonator 210 and the ground, for example. In other words, the matching resonator 210 and the extension coil 240 may be sequentially disposed from the node 206 to the ground in series.

Figure 12:
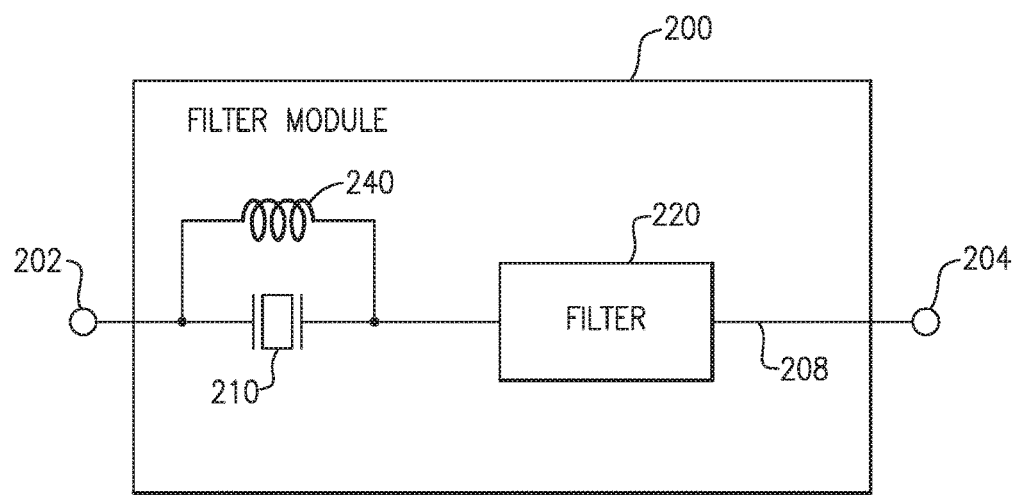
FIG. 12 is a diagram of another example of a filter module according to one embodiment.

FIG. 12 is a circuit diagram showing another example of the filter module 200 according to certain embodiments. In this example, the filter module 200 has a configuration similar to that shown in FIG. 9, and further includes an extension coil 240 connected in parallel with the matching resonator 210. In other words, the extension coil 240 and the matching resonator 210 are connected in parallel at the input of the filter 220 between the input contact 202 and the filter 220.

In the example of the filter module 200 shown in FIG. 12, the antiresonant frequency of the matching resonator 210 is shifted higher by the extension coil 240. Therefore, even if the passband of the filter 220 is relatively broad, the bandwidth between the resonant frequency and the antiresonant frequency of the matching resonator 210 can be made sufficiently broad such that the passband of the filter can be included in the band ranging between the resonant frequency and the antiresonant frequency. Therefore, even if the passband of the filter 220 is broader, the impedance of the filter module 200 can be configured as inductive.

Figure 13:
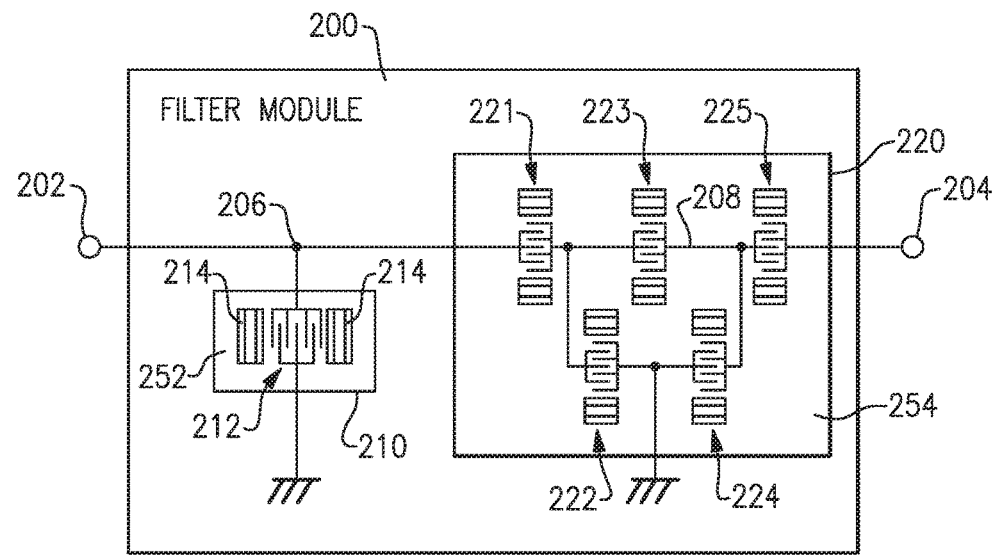
FIG. 13 is a circuit diagram illustrating an example of a filter module according to certain embodiments having components configured on separate substrates.

FIG. 13 illustrates an example of the filter module 200, having the configuration shown in FIG. 5, and in which the matching resonator 210 and the filter 220 are configured respectively on separate substrates. In this example, the filter module 200 includes a first substrate 252 on which the matching resonator 210 is formed, and a second substrate 254 on which the filter 220 is formed. The filter 220 is implemented using SAW resonators having a ladder-type configuration. In this example, the matching resonator 210 is connected at the input of the filter 220 in a parallel connection manner, as discussed above with reference to FIG. 5.

Provided on the first substrate 252 are an interdigital transducer (IDT) electrode 212 and a pair of reflectors 214 opposing each other on opposite sides of the IDT electrode, which form a SAW resonator. The IDT electrode 212 is connected between the node 206 joining the input contact 202 with the filter 220 and the ground. The filter 220 includes a plurality of series-arm SAW resonators 221, 223, and 225 formed on the second substrate 254 and connected in series along the signal path 208 from the input contact 202 toward the output contact 204. The filter 220 further includes parallel-arm SAW resonators 222 and 224, which are connected in parallel between the ground and respective nodes joining the SAW resonators 221, 223, 225, as shown. The series-arm SAW resonators 221, 223, 225 and the parallel-arm SAW resonators 222, 224 form a ladder-type filter. Each of the SAW resonators 221, 222, 223, 224, 225 includes an IDT electrode and a pair of reflectors, as shown.

As discussed above, in the example shown in FIG. 13, the filter module 200 is configured to have the matching resonator 210 formed on the first substrate 252 and the filter 220 formed on the second substrate 254. Therefore, different materials may be used for the first substrate 252 and the second substrate 254, respectively, such that options for the materials can be increased. Consequently, the design flexibility of the filter module 200 can be improved.

Figure 14:
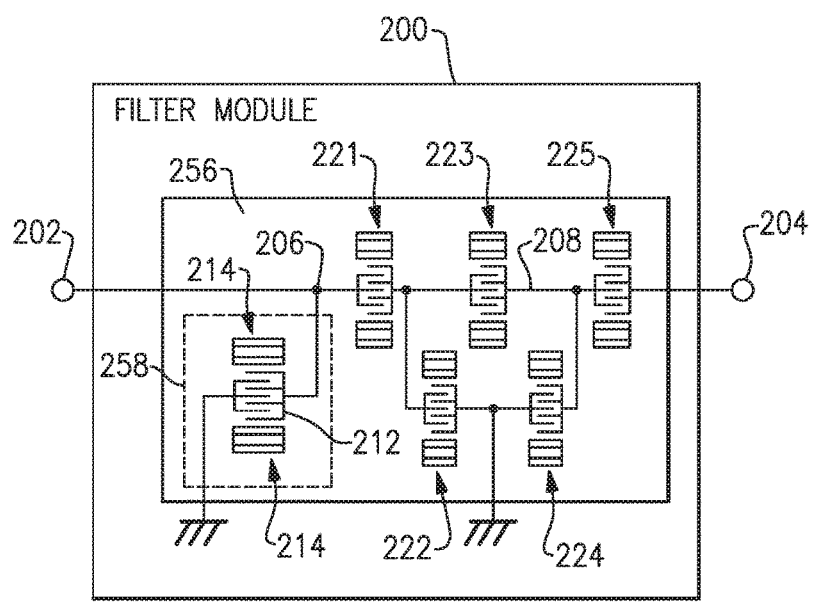
FIG. 14 is a circuit diagram illustrating an example of a filter module according to certain embodiments having components configured on a same single substrate.

FIG. 14 illustrates another example of the filter module 200, having the configuration shown in FIG. 5, and in which the matching resonator 210 and the filter 220 are formed on a common substrate 256. Formed on the substrate 256 included in the filter module 200 are the SAW resonators 221, 223, 225, which are connected in series along the signal path 208 from the input contact 202 toward the output contact 204, and the SAW resonators 222 and 224, which are connected in parallel between the ground and respective nodes joining the SAW resonators 221, 223, 225. As in the example of FIG. 13, the SAW resonators 221, 223, 225 and the SAW resonators 222, 224 constitute a ladder-type filter and provide the filter 220. Also formed on the substrate 256 are the IDT electrode 212 and the pair of reflectors 214 forming the matching resonator 210. As discussed above, in this example the matching resonator 210 is connected at the input side of the filter 220 in a parallel connection manner. Thus, the IDT electrode 212 of the matching SAW resonator 210 is connected between the ground and the node 206 joining the input contact 202 with the SAW resonator 221 at an input end of the ladder-type filter.

In the example of FIG. 14, the filter module 200 includes the filter 220 and the matching resonator 210 on the common substrate 256. Therefore, the filter module 200 may be downsized. Furthermore, on the substrate 256, a predetermined region 258 including the matching resonator 210 can be formed by a material having a greater electromechanical coupling coefficient (k2). For example, a material different from the original material of the substrate 256 can be spattered, bonded and the like to form a thin film on the predetermined region 258. As such, choosing a material having a greater electromechanical coupling coefficient for the predetermined region 258 including the matching SAW resonator 210 may enable the filter module 200 to be downsized and may allow greater design flexibility for the filter module.

Figure 15:
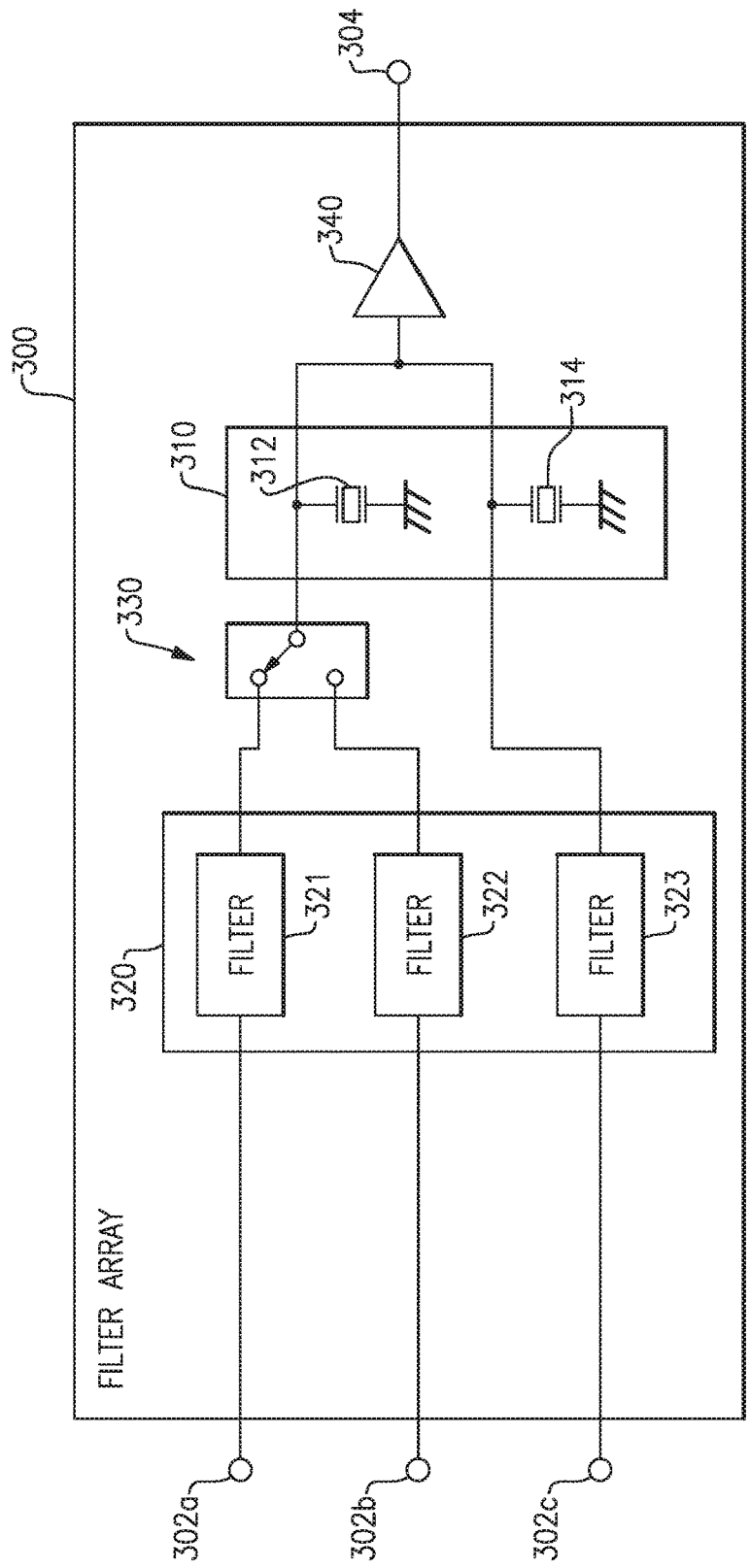
FIG. 15 is a diagram of an example of a filter array in which filter modules according to certain embodiments can be used.

FIG. 15 is a circuit diagram showing an example of a filter array 300 in which the filter module 200 according to certain embodiments is applied. In the illustrated example, the filter array 300 includes a matching resonator 312, 314 disposed following each of the filters. In other examples the matching resonators can be disposed preceding the filters, as discussed above with reference to FIG. 5, for example.

The filter array 300 includes a filter bank 320, which includes three band-pass filters, i.e., a first narrow-band filter 321, a second narrow-band filter 322 and a third broad-band filter 323. An individual signal is input to each of the first narrow-band filter 321, the second narrow-band filter 322 and the third broad-band filter 323 via respective input contacts 302*a*, 302*b*, 302*c*. The signals outputted from the first narrow-band filter 321 and the second narrow-band filter 322 are switched by a changeover switch 330, and a selected one is input to a low-noise amplifier 340 through a matching resonator bank 310. The signal outputted from broad-band filter 323 is also input to the low-noise amplifier 340 through the matching resonator bank 310.

In the matching resonator bank 310, a first matching resonator 312 is disposed between the ground and a node joining the changeover switch 330 with the low-noise amplifier 340. Furthermore, a second matching resonator 314 is disposed between the ground and a node joining the broad-band filter 323 with the low-noise amplifier 340.

In the matching resonator bank 310, each of the passbands of the first narrow-band filter 321 and the second narrow-band filter 322 is configured to be included in a band ranging between a resonant frequency and an antiresonant frequency of the first matching resonator 312. Furthermore, respective center frequencies of the passbands of the first narrow-band filter 321 and the second narrow-band filter 322 are configured to be lower than a center frequency of the band ranging between the resonant frequency and the antiresonant frequency of the first matching resonator 312.

The first matching resonator 312 can be a SAW resonator formed on a substrate made of lithium niobate (LiNbO$_3$) having a low cut angle. Such a material having a greater electromechanical coupling coefficient (k2) can increase a bandwidth between the resonant frequency and the antiresonant frequency. Therefore, both of the passbands of the first narrow-band filter 321 and the second narrow-band filter 322 can be included in the band ranging between the resonant frequency and the antiresonant frequency of the first matching resonator 312.

The passband of the broad-band filter 323 is configured to be included in a band ranging between a resonant frequency and an antiresonant frequency of the second matching resonator 314. Furthermore, a center frequency of the passband of the broad-band filter 323 is configured to be lower than a center frequency of the band ranging between the resonant frequency and the antiresonant frequency of the second matching resonator 314.

In the matching resonator bank 310, the first narrow-band filter 321 and the second narrow-band filter 322 use a common first matching resonator 312. Therefore, the circuit structure can be smaller such that the filter array 300 can be downsized.

The first matching resonator 312 can be configured to be inductive in the passbands of the first narrow-band filter 321 and the second narrow-band filter 322, and the second matching resonator 314 can be configured to be inductive in the passband of the broad-band filter 323. Therefore, the impedances of the passbands of the first narrow-band filter 321, the second narrow-band filter 322 and the broad-band filter 323 included in the filter bank 320 can be configured to be inductive without adding a conventional matching inductor (see FIGS. 1 and 2).

Each of the first matching resonator 312 and the second matching resonator 314 included in the matching resonator bank 310 has a higher Q factor in each inductive region such that any degradation of and the insertion loss and the noise figure can be reduced. Furthermore, the first narrow-band filter 321, the second narrow-band filter 322 and the broad-band filter 323 included in the filter bank 320 have passbands, each of which is positioned in a region where the inductive components of the first matching resonator 312 and the second matching resonator 314 included in the matching resonator bank 310 have smaller variations and the matching can be facilitated.

In the passbands of the first narrow-band filter 321, the second narrow-band filter 322 and the broad-band filter 323 included in filter bank 320, the resonant frequencies of the first matching resonator 312 and the second matching resonator 314 included in the matching resonator bank 310 can be attenuation poles. Therefore, this may advantageously ensure the attenuation level in a stopband positioned on a lower frequency side than the passbands of the first narrow-band filter 321, the second narrow-band filter 322 and the broad-band filter 323 included in the filter bank 320.

Examples of the filter module 200 and filter array 300 can be used in a wide variety of electronic devices. For example, the filter module 200 or filter array 300 can be used in an antenna duplexer, which itself can be incorporated into a variety of electronic devices, such as RF front-end modules and communication devices.

Figure 16:
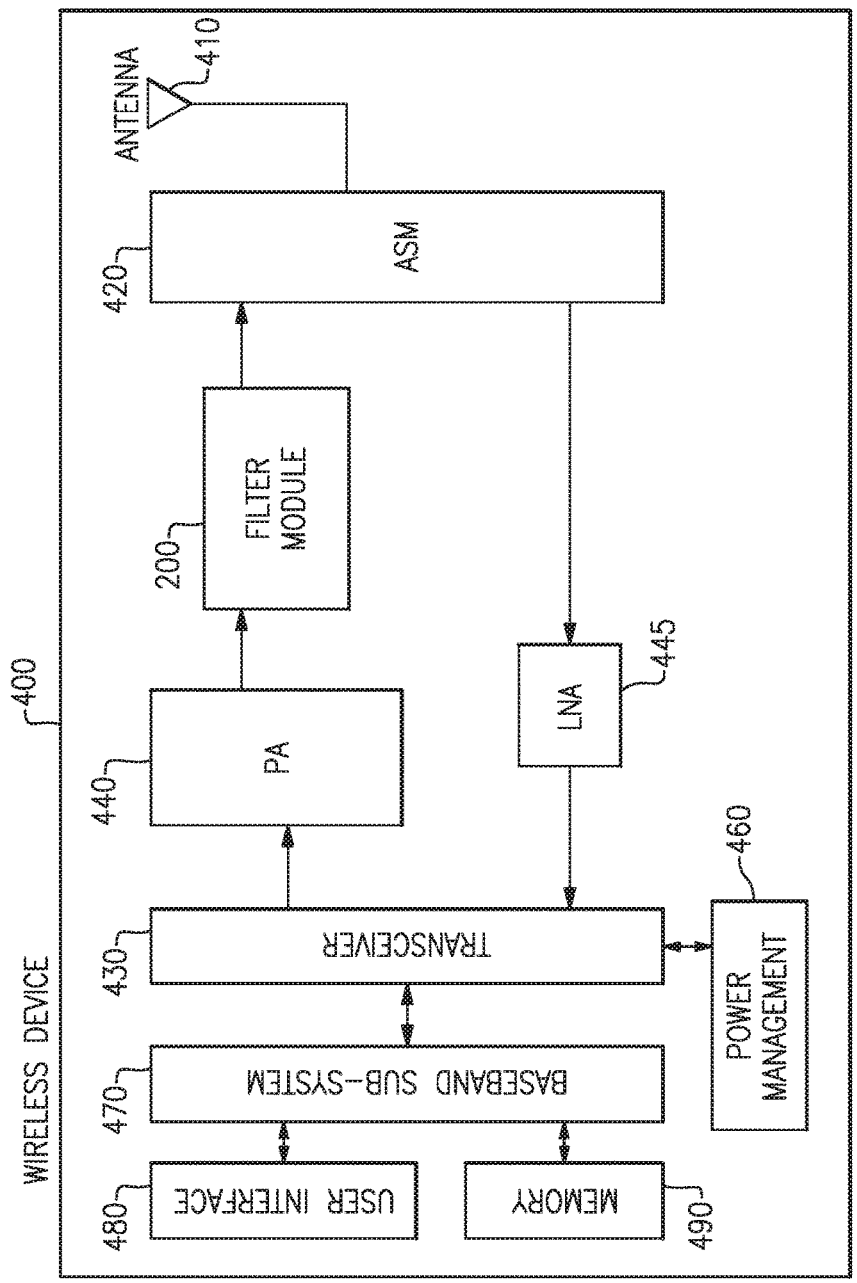
FIG. 16 is a block diagram of one example of a wireless device including a filter module according to certain embodiments.

FIG. 16 is a block diagram of one example of a wireless device 400 including a filter module 200. The wireless device 400 can be a cellular phone, smart phone, tablet, modem, communication network or any other portable or non-portable device configured for voice or data communication. The wireless device 400 can receive and transmit signals from an antenna 410. The antenna 410 is coupled to an antenna switch module (ASM) 420 that can enable switching between a transmit mode and a receive mode, for example, or between different frequency bands within the transmit mode or receive mode, for example. The wireless device 400 further includes a transceiver 430 that is configured to generate signals for transmission and/or to process received signals. Signals generated for transmission are received by a power amplifier (PA) 440, which amplifies the generated signals from the transceiver 430. Received signals are amplified by a low noise amplifier (LNA) 445 and then provided to the transceiver 430. As is also shown in FIG. 16, the antenna 410 both receives signals that are provided to the transceiver 430 via the antenna switch module 420 and the LNA 445 and also transmits signals from the wireless device 400 via the transceiver 430, the PA 446, and the antenna switch module 420. However, in other examples multiple antennas can be used.

The power amplifier 440 can be used to amplify a wide variety of RF or other frequency-band transmission signals. For example, the power amplifier 440 can receive an enable signal that can be used to pulse the output of the power amplifier to aid in transmitting a wireless local area network (WLAN) signal or any other suitable pulsed signal. The power amplifier 440 can be configured to amplify any of a variety of types of signal, including, for example, a Global System for Mobile (GSM) signal, a code division multiple access (CDMA) signal, a W-CDMA signal, a Long Term Evolution (LTE) signal, or an EDGE signal. In certain embodiments, the power amplifier 440 and associated components including switches and the like can be fabricated on GaAs substrates using, for example, pHEMT or BiFET transistors, or on a Silicon substrate using CMOS transistors.

Figure 17:
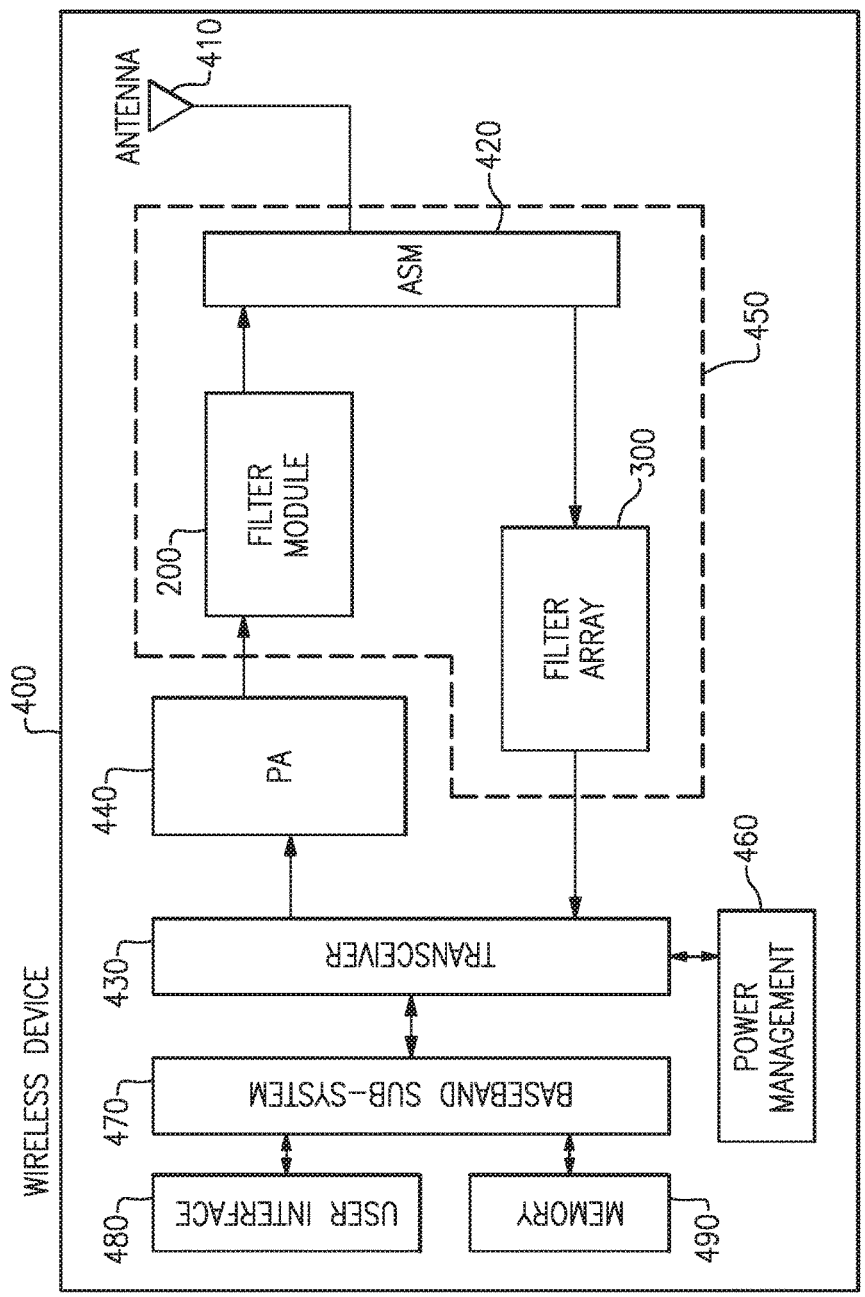
FIG. 17 is a block diagram of an example of a wireless device including a filter module and a filter array according to certain embodiments.

In the example shown in FIG. 16, the filter module 200 is shown in the transmit path positioned between the power amplifier 440 and the antenna switch module 420. However, a variety of other configurations can be implemented. For example, the wireless device 400 can include one or more filter modules 200 in the transmit path or the receive path. Further, the filter module(s) can be positioned before or after amplifiers or switches in either path. In addition, the wireless device 400 can include one or more examples of the filter array 300 instead of or in addition to the filter module(s) 200. FIG. 17 illustrates an example of the wireless device 400 including a filter module 200 connected in the transmit path, and a filter array 300 connected in the receive path, for example. One or more filter module(s) 200 and filter array(s) 300 can optionally be combined with the antenna switch module 420 in a filtering and switching assembly 450.

The wireless device 400 of FIGS. 16 and 17 further includes a power management sub-system 460 that is connected to the transceiver 430 and manages the power for the operation of the wireless device 400. The power management system 460 can also control the operation of a baseband sub-system 470 and various other components of the wireless device 400. The power management system 460 can include, or can be connected to, a battery (not shown) that supplies power for the various components of the wireless device 400.

In certain embodiments, the baseband sub-system 470 is connected to a user interface 480 to facilitate various input and output of voice and/or data provided to and received from the user. The baseband sub-system 470 can also be connected to a memory 490 that is configured to store data and/or instructions to facilitate the operation of the wireless device, and/or to provide storage of information for the user.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. It is to be appreciated that embodiments discussed herein are not limited in application to the details of construction and the arrangement of components set forth in the foregoing description. The concepts and technology disclosed herein are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment. Accordingly, the foregoing description is by way of example only, and the scope of the invention should be determined from proper construction of the appended claims, and their equivalents.

What is claimed is:

1. A filter module comprising:
an input contact and an output contact;
a filter having a first passband and being disposed along a signal path extending from the input contact to the output contact; and
a matching resonator configured for impedance matching of the filter and coupled to the filter, the first passband of the filter being included in a frequency band ranging between a resonant frequency of the matching resonator and an antiresonant frequency of the matching resonator.

2. The filter module of claim 1 wherein a first center frequency of the first passband of the filter is lower than a second center frequency of the frequency band ranging between the resonant frequency of the matching resonator and the antiresonant frequency of the matching resonator.

3. The filter module of claim 1 wherein the matching resonator is connected in series between the filter and one of the input contact and the output contact.

4. The filter module of claim 3 further comprising an extension coil connected in parallel with the matching resonator.

5. The filter module of claim 1 wherein the matching resonator is connected between ground and one of a first node along the signal path joining the input contact to the filter and a second node along the signal path joining the output contact to the filter.

6. The filter module of claim 5 further comprising an extension coil connected in series with the matching resonator.

7. The filter module of claim 1 wherein the filter and the matching resonator each include at least one of a surface acoustic wave resonator, a bulk acoustic wave resonator, and a film bulk acoustic wave resonator.

8. The filter module of claim 1 wherein the filter is a ladder-type filter including a plurality of series-arm resonators connected in series along the signal path and a plurality of a parallel-arm resonators connected between the signal path and a ground.

9. The filter module of claim 8 wherein the matching resonator is a surface acoustic wave resonator.

10. The filter module of claim 9 wherein the plurality of series-arm resonators and the plurality of parallel-arm resonators of the filter are formed on a first substrate and the matching resonator is formed on a second substrate, the first and second substrates being formed of different materials.

11. The filter module of claim 9 wherein the plurality of series-arm resonators of the filter, the plurality of parallel-arm resonators of the filter, and the matching resonator are formed on a common substrate.

12. The filter module of claim 11 wherein the plurality of series-arm resonators and the plurality of parallel-arm resonators of the filter are formed on a first region of the substrate and the matching resonator is formed on a second region of the substrate, the substrate being made of a first material and the second region including a thin film of a second material, the second material having a higher electromechanical coupling coefficient than the first material.

13. A filter array comprising:
a filter bank including a first filter having a first passband, and a second filter having a second passband different from the first passband;
a matching resonator bank including a first matching resonator, the first passband and the second passband both being included in a first frequency band ranging between a resonant frequency of the first matching resonator and an antiresonant frequency of the first matching resonator; and
a switch operable to selectively connect one of the first and second filters to the first matching resonator.

14. The filter array of claim 13 wherein each of a center frequency of the first passband and a center frequency of the second passband is lower than a center frequency of the first frequency band ranging between the resonant frequency of the first matching filter and the antiresonant frequency of the first matching resonator.

15. The filter array of claim 13 wherein the switch is connected between outputs of the first and second filters and the first matching resonator.

16. The filter array of claim 13 wherein the filter bank further includes a third filter having a third passband different from the first and second passbands, and the matching resonator bank further includes a second matching resonator connected to the third filter, the third passband being included in a second frequency band ranging between a resonant frequency of the second matching resonator and an antiresonant frequency of the second matching resonator.

17. The filter array of claim 16 wherein the second matching resonator is connected to an output of the third filter.

18. The filter array of claim 17 further comprising a low noise amplifier connected to the output of the third filter and to the switch.

19. A wireless device comprising:
a transceiver configured to generate transmit signals for transmission;
a power amplifier connected to the transceiver and configured to amplify the transmit signals; and
a filter module configured to receive the transmit signals from the power amplifier, the filter module including an input contact connected to the power amplifier, an output contact, a filter having a first passband and being disposed along a signal path extending from the input contact to the output contact, and a matching resonator coupled to the filter and configured for impedance matching of the filter, the first passband of the filter being included in a frequency band ranging between a resonant frequency of the matching resonator and an antiresonant frequency of the matching resonator.

20. The wireless device of claim 19 further comprising:
an antenna configured to transmit the transmit signals; and
an antenna switch module connected between the output contact of the filter module and the antenna.

* * * * *

UNITED STATES PATENT AND TRADEMARK OFFICE
CERTIFICATE OF CORRECTION

PATENT NO.        : 10,333,484 B2
APPLICATION NO.   : 15/790151
DATED             : June 25, 2019
INVENTOR(S)       : Tomoya Komatsu It is certified that error appears in the above-identified patent and that said Letters Patent is hereby corrected as shown below:

In the Specification

Column 2, Line 47, delete "tantalite" and insert -- tantalate --.

Page 1 of 1

Signed and Sealed this
Thirtieth Day of July, 2019

Andrei Iancu
*Director of the United States Patent and Trademark Office*